United States Patent [19]

Campbell

[11] 4,161,407

[45] Jul. 17, 1979

[54] CROSSLINKABLE POLYMERS HAVING VINYLSULFONYL GROUPS OR STYRYLSULFONYL GROUPS AND THEIR USE AS HARDENERS FOR GELATIN

[75] Inventor: Gerald A. Campbell, Webster, N.Y.

[73] Assignee: Eastman Kodak Company, Rochester, N.Y.

[21] Appl. No.: 839,880

[22] Filed: Oct. 6, 1977

[51] Int. Cl.$^2$ .................. G03C 1/72; C08L 89/00; C08F 28/00; C08G 75/00
[52] U.S. Cl. ............................. 96/114; 260/8; 526/286; 525/379; 525/353
[58] Field of Search ............. 260/79.3 MU, 8; 96/114; 526/31; 528/286

[56] References Cited

U.S. PATENT DOCUMENTS

| | | | |
|---|---|---|---|
| 2,500,149 | 3/1950 | Boyer | 260/79.3 |
| 2,723,254 | 11/1955 | Chaney | 260/79.3 MU |
| 2,852,381 | 9/1958 | Minsk et al. | 96/114 |
| 3,490,911 | 1/1970 | Burness | 96/111 |
| 3,554,987 | 7/1971 | Smith | 96/114 |
| 3,592,655 | 7/1971 | Dykstra | 260/79.3 NU |
| 3,625,694 | 12/1971 | Cohen et al. | 96/84 |
| 3,850,639 | 11/1974 | Dallon et al. | 96/111 |

Primary Examiner—Jack P. Brammer
Attorney, Agent, or Firm—Arthur H. Rosenstein

[57] ABSTRACT

Polymers containing pendent substituted ethylsulfonyl, vinylsulfonyl or styrylsulfonyl groups are useful as gelatin hardeners or can be crosslinked by bis-nucleophiles or by exposure to ultraviolet light.

10 Claims, No Drawings

CROSSLINKABLE POLYMERS HAVING VINYLSULFONYL GROUPS OR STYRYLSULFONYL GROUPS AND THEIR USE AS HARDENERS FOR GELATIN

This invention relates to polymers containing vinylsulfonyl, substituted ethylsulfonyl or styrylsulfonyl pendent groups. These polymers can be used as gelatin hardeners and can be crosslinked by bis-nucleophiles or by exposure to ultraviolet light.

Vinylsulfonyl alkyl groups attached to a plurality of tertiary or quaternary nitrogen atoms and/or to a plurality of ether oxygen atoms are described as effective gelatin hardeners according to U.S. Pat. No. 3,490,911, issued Jan. 20, 1970 to Burness et al. However, the compounds of the patent do not contain pendent groups on either crosslinked or uncrosslinked polymers.

U.S. Pat. No. 3,850,639, issued Nov. 26, 1974 to Dallon et al shows the use of bis(vinylsulfonylmethyl) ether for hardening gelatin. These types of ethers have been used as gelatin hardeners for some time.

U.S. Pat. No. 2,500,149, issued Mar. 14, 1950 to Boyer discloses the sulfonation of copolymers of monovinyl and polyvinyl aromatic compounds.

U.S. Pat. No. 3,625,694, issued Dec. 7, 1971 to Cohen et al describes polymers containing various reactive groups to act as mordants for dyes useful in the Technicolor process. Vinylsulfonyl polymers of the type described herein are not disclosed.

It is an object of this invention to provide novel polymeric compositions of matter which are useful in photographic elements.

It is a further object of this invention to provide polymers which will crosslink gelatin and will not migrate from one layer to another in a film unit.

It is also an object of this invention to provide polymers including copolymers that can be crosslinked by actinic light or hardened with bis-nucleophilic agents.

It is a still further object of this invention to provide polymers which crosslink gelatin and exhibit little or no after-hardening.

It is a further object to provide copolymer which will be useful as mordants for certain dyes in photographic processes, particularly color image transfer processes.

SUMMARY OF THE INVENTION

The above and other objects are achieved with crosslinkable polymers containing pendent substituted ethylsulfonyl, vinylsulfonyl or styrylsulfonyl groups. These polymers can be used to harden gelatin, as mordants for certain dyes in photographic processes, or to be crosslinked by treatment with bis-nucleophilic agents or by exposure to ultraviolet light. Photographic compositions can contain the polymers containing pendent substituted ethylsulfonyl, vinylsulfonyl or styrylsulfonyl groups and gelatin.

DETAILED DESCRIPTION OF THE INVENTION

In one embodiment of this invention, the polymer has repeating units having the formula:

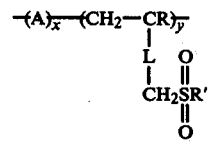

wherein A is a polymerized $\alpha,\beta$-ethylenically unsaturated addition polymerizable monomer or a mixture of such polymerizable monomers; x and y are the molar percentages of the resulting units in the polymer and are whole integers, x being from 10 to about 95 percent and y being 5 to 90 percent; R is hydrogen or an alkyl group having 1 to 6 carbon atoms; R' is $-CH=CHR^2$ or $-CH_2CH_2X$ where X is a leaving group which is displaced by a nucleophile or eliminated in the form of HX by treatment with base; $R^2$ is alkyl, aryl or hydrogen; $-L-$ is a linking group selected from the group consisting of alkylene, preferably containing about 1 to 6 carbon atoms, such as methylene, ethylene, isobutylene and the like; arylene of about 6 to 12 nuclear carbon atoms, such as phenylene, tolylene, naphthalene and the like; $-COZ-$ or $-COZR_3-$; $R^3$ is alkylene, preferably of 1 to 6 carbon atoms, or arylene, preferably of 6 to 12 carbon atoms; and Z is O or NH.

A can be any polymerizable $\alpha,\beta$-ethylenically unsaturated polymerizable monomer such as styrene, acrylamide, acrylic and methacrylic acid, acrylic and methacrylic esters such as butyl acrylate, ethyl methacrylate and the like, olefins such as ethylene, propylene, butadiene and the like. Although x can be from 10 to 95 percent, it is preferred that it be from 20 to 80 percent.

R can be hydrogen or alkyl having from 1 to 6 carbon atoms, such as methyl, ethyl, isopropyl, hexyl and the like.

$R^2$ is hydrogen or alkyl, preferably containing from 1 to 6 carbon atoms, such as methyl, ethyl, isopropyl and the like, or aryl, preferably containing from about 6 to about 12 carbon atoms, such as phenyl, naphthyl and the like.

It is noted that throughout the specification and claims the terms alkyl and aryl are intended to include substituted alkyl and aryl wherein the substituents do not impair the hardening properties of the polymer. Thus, substituents such as Cl, Br, nitro, oxo, carboxamide, carboxylate and the like could be included.

X is a leaving group which is displaced by a nucleophile or eliminated by treatment with base such as chloro, bromo, iodo, acetoxy, methylsulfonyloxy, p-tolylsulfonyloxy, trimethylammonio salt, pyridinio-salt, or the like.

The portion of the polymer represented by (A)x can form a copolymer, terpolymer or the like and can preferably be derived from such unsaturated monomers as 2-acrylamido-2-methylpropane sulfonic acid, vinylbenzyl chloride, maleic anhydride, etc., as well as those noted above.

The polymers of this invention can be prepared in the following manner: Various monomers containing certain sulfonyl groups may be caused to homopolymerize or copolymerize with other $\alpha,\beta$-ethylenically unsaturated monomers to prepare polymer intermediates which, in turn, can be converted to other polymers having pendent $\alpha,\beta$-unsaturated sulfonyl groups.

Typical monomers have the following structure:

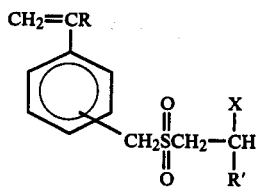

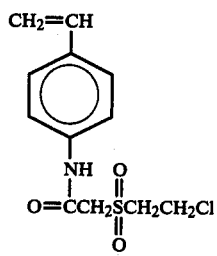

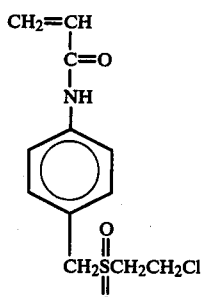

and

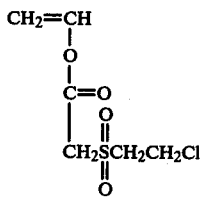

wherein R, R' and X are as described above.

The polymers are typically formed by dissolving the monomers as described above in appropriate solvents and then heating the resulting solution with free radical generating initiators in the absence of oxygen. Latex polymers can also be prepared by standard procedures for emulsion polymerization.

The polymeric hardeners of this invention having a polymeric backbone and unsubstituted unsaturated hydrocarbon terminal groups are resistant to migration from one gelatin layer to another. These polymers incorporated in gelatin or in compositions containing gelatin such as silver halide emulsions will provide the layers coated therefrom with good resistance to melting and swell. The polymers in accordance with this invention have a hardening effect on gelatin when used therewith in almost any proportion but a proportion of at least one percent based on the gelatin is ordinarily most desirable. The optimum range for the use of the hardeners and gelatin compositions is ordinarily 1 to 5 percent, based on the weight of the gelatin.

The polymers can also be used as mordants for certain dyes, such as amine dyes, phenol dyes and the like. The mordants which can be cationic, anionic or nonionic are effectively used in color image transfer units. This is described in detail in copending U.S. application Ser. No. 839,879, filed on the same day as this application by Campbell, Cohen, Hamilton and Villard, entitled "Photographic Film Units Containing a Polymeric Mordant Which Covalently Bonds With Certain Dyes." The polymers of this invention can also be hardened with bis-nucleophilic agents such as 1,6-hexanediamine, piperidine, 6-aminohexanol, p-phenylenediamine and the like by simply mixing with the polymer solution before coating or could be hardened by exposure to ultraviolet light.

The following examples are included for a further understanding of the invention.

PREPARATION 1

Vinylbenzyl 2-Hydroxyethyl Sulfide

To a solution of 408 g (6 moles) of sodium ethoxide in 3 l of absolute ethanol, cooled to 0° to 5° C., was added dropwise 476 g (6.1 moles) of 2-mercaptoethanol. Following addition, the solution was stirred for an additional hour at room temperature and then 915 g (6.0 moles) of vinylbenzyl chloride (60 percent m, 40 percent p) was added dropwise. After addition, the mixture was refluxed for 1 hour and was then cooled to room temperature. The sodium chloride was removed by filtration and the solvent was removed on a rotary evaporator to give the product as a yellow oil. The oil was distilled via a short path column to give 626.5 g (54 percent) of the desired product (b.p. 110° to 120° C. and 7 microns Hg).

Anal. Calcd for $C_{11}H_{14}OS$: C, 67.9; H, 7.2; S, 16.5; Found: C, 67.7; H, 7.4; S, 16.5.

PREPARATION 2

Vinylbenzyl 2-Hydroxyethyl Sulfone

To a solution of 94 g (0.483 moles) of vinylbenzyl 2-hydroxyethyl sulfide and 2.5 g of m-dinitrobenzene in 1 liter of methanol at 0° to 5° C. was added dropwise 194 g (1.03 moles) of 40 percent peracetic acid solution. The reaction was stirred overnight at room temperature and the methanol was evaporated. The clear oil was added to 1 liter of ice water to crystallize the product. The solid was collected by filtration and recrystallized from 2 liters of 80 percent water, 20 percent ethanol to give 76.5 g (70.2 percent) of the desired product (mp 52° to 64° C.).

Anal. Calcd for $C_{11}H_{14}O_3S$: C, 58.4; H, 6.2; S, 14.2; Found: C, 58.4; H, 6.2; S, 14.1.

PREPARATION 3

Vinylbenzyl 2-Chloroethyl Sulfone

To a solution of 50 g (0.221 moles) of vinylbenzyl 2-hydroxyethyl sulfone, 19.2 g (0.243 moles) of pyridine, and 1 g of m-dinitrobenzene in 500 ml of tetrahydrofuran at 0° to 5° C. was added dropwise 28.9 g (0.243 moles) of thionyl chloride. After the addition was complete, the mixture was refluxed for 2 hours, cooled to 0° to 5° C., and the pyridine hydrochloride was removed by filtration. The solvent was then evaporated to leave an oil which was added to one liter of ice water to crystallize the product. The solid was collected by filtration and recrystallized from 1.6 liters of 50 percent water, 50 percent ethanol to give 46 g (85.2 percent) of the desired product (mp 62° to 84° C.).

Anal. Calcd for $C_{11}H_{13}ClO_2S$: C, 54.0; H, 5.3; Cl, 14.5; S, 13.1; Found: C, 53.6; H, 5.3; Cl, 14.5; S, 13.4.

PREPARATION 4

Vinylbenzyl 2-Phenyl-2-hydroxyethyl Sulfide

To 125 ml of absolute ethanol was added 5.7 g (0.247 moles) of sodium metal. After the sodium had dissolved, the solution was cooled to 0° to 5° C. and 38 g (0.247 moles) of 1-phenyl-2-mercaptoethanol was added dropwise. After addition, the reaction was stirred at 0° to 5° C. for 1 hour and then 37.7 g (0.247 moles) of vinylbenzyl chloride was added dropwise. After the addition was complete, 0.5 g of hydroquinone was added and the mixture was refluxed for 2 hours. The mixture was cooled and the sodium chloride was removed by filtration. The solvent was evaporated and the residue was added to 100 ml of water. The aqueous mixture was extracted with three 100 ml portions of ether and the combined ethereal extracts were dried over anhydrous magnesium sulfate, filtered, and the solvent evaporated to leave 70 g of the product as a crude oil. Due to its high boiling point, the product was used without further purification in the synthesis of the following sulfone.

PREPARATION 5

Vinylbenzyl 2-Phenyl-2-hydroxyethyl Sulfone

To a solution of 140 g (0.495 moles) of vinylbenzyl 2-phenyl-2-hydroxyethyl sulfide and 1.25 g of m-dinitrobenzene in 1.5 l of methanol at 0° to 5° C. was added dropwise 194 g (1.03 moles) of 40 percent peracetic acid solution. After addition, the mixture was stirred overnight at room temperature. The methanol was evaporated to leave a solid which was washed well with water and dried to give 133 g of the crude product. Recrystallization from 1 l of chloroform deposited 99 g (66 percent from vinylbenzyl chloride) (mp 133° to 154°).

Anal. Calcd for $C_{17}H_{18}O_3S$: C, 61.5; H, 6.0; S, 10.6; Found: C, 61.4; H, 6.2; S, 10.6.

EXAMPLE 1

Poly(vinylbenzyl 2-Chloroethyl Sulfone)

A solution of 35 g of vinylbenzyl 2-chloroethyl sulfone as in Preparation 3 and 175 g of 2,2'-azobis(2-methylpropionitrile) in 70 ml of dimethyl sulfoxide was heated at 60° C. under a nitrogen atmosphere for 25 hours. The polymer was precipitated in methanol, collected by filtration, and dried in vacuo at room temperature to give 32.5 g (93 percent) of polymer. $\{\eta\}_{DMF}=0.65$.

Anal. Calcd for $C_{11}H_{13}ClO_2S$: C, 54.0; H, 5.3; Cl, 14.5; S, 13.1; Found: C, 54.1; H, 5.6; Cl, 13.9; S, 13.1.

All inherent viscosities reported herein are determined at 25° C. at 0.25 g/deciliter of solution.

Copolymers derived from vinylbenzyl-2-chloroethyl sulfone are given in Table I.

Table 1

Copolymers Derived from Vinylbenzyl 2-Chloroethyl Sulfone

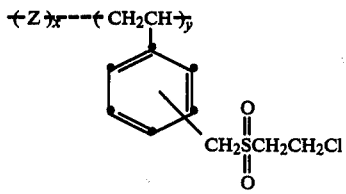

| Monomer from which Z is Derived | x | y | Polymerization Method | $[\eta]^1$ | Anal. Calcd/Found | | | | |
|---|---|---|---|---|---|---|---|---|---|
| | | | | | C | H | Cl | S | N |
| 2-Acrylamido-2-methylpropane sulfonic acid | 2 | 1 | solution(DMSO) | 0.33 | 45.8 | 5.9 | 5.6 | 14.6 | 4.1 |
| | | | | | 45.4 | 5.4 | 8.2 | 13.9 | 2.3 |
| Acrylamide | 9 | 1 | solution(DMSO) | — | 51.6 | 6.6 | 4.0 | 3.6 | 14.2 |
| | | | | | 49.0 | 6.6 | 3.0 | 3.2 | 13.5 |
| Vinylbenzyl chloride | 1 | 1 | emulsion | 0.65 | 60.5 | 5.5 | 17.9 | 8.1 | — |
| | | | | | 59.4 | 5.3 | 17.4 | 7.9 | — |
| Styrene | 1 | 1 | emulsion | 1.33 | 65.4 | 6.1 | 10.2 | 9.4 | — |
| | | | | | 64.1 | 5.9 | 9.9 | 9.4 | — |
| Maleic anhydride | 1 | 1 | solution (benzene) | 0.45 | 52.6 | 4.4 | 10.3 | 9.4 | — |
| | | | | | 53.3 | 4.5 | 10.2 | 9.1 | — |

[1] Viscosity was measured in dimethylformide (DMF).

EXAMPLE 2

Poly(vinylbenzyl Vinyl Sulfone)

To a solution of 32.5 g of poly(vinylbenzyl 2-chloroethyl sulfone) ($\{\eta\}_{DMF}=0.65$) and 100 mg of m-dinitrobenzene in 100 ml of dimethylformamide at 0° to 5° C. was added 20 g of triethylamine. After stirring for 1 hour at 0° to 5° C., the triethylamine hydrochloride was removed by filtration and the polymer was precipitated in methanol. The polymer was collected, washed well with methanol, and dissolved while still damp in 1,3-dichloroethane. The yield was 25.0 g of dry polymer. The dry polymer was soluble in methylene chloride, 1,2-dichloroethane and DMF ($\{\eta\}_{DMF}=0.55$).

Anal. Calcd $C_{11}H_{12}O_2S$: C, 63.4; H, 5.8; S, 15.4; Cl, 0; Found: C, 63.0; H, 5.9; S, 15.4; Cl, 0.1.

EXAMPLE 3

Poly(vinylbenzyl 2-Phenyl-2-hydroxyethyl Sulfone)

A solution of 10.0 g of vinylbenzyl 2-phenyl-2-hydroxyethyl sulfone of Preparation 5 and 50 mg of 2,2'-azobis (2-methylpropionitrile) in 20 ml of dimethyl sulfoxide was heated at 60° C. under a nitrogen atmosphere overnight. The polymer was isolated in isopropanol, collected, washed well with isopropanol, and dried in vacuo at room temperature to give 10 g ($\{\eta\}_{DMF}=0.61$.

Anal. Calcd for $C_{17}H_{18}O_3S$: C, 67.5; H, 6.0; S, 10.6; Found: C, 67.3; H, 6.3; S, 10.8.

EXAMPLE 4

Poly(vinylbenzyl Styryl Sulfone)

hardener. The coatings were exposed, processed for 5 minutes in Kodak DK-50 developer, fixed, washed and dried. The results obtained are given in Table II.

Table II

The Hardening of Gelatin Silver Halide Emulsions with Polymeric Vinylsulfonyl Compounds

| Hardener | Grams/Ag mole | Rel. Speed | γ | Fog | % Swell[1] | | |
|---|---|---|---|---|---|---|---|
| | | | | | 100° F.(38° C.) 50%RH 3 days | 120° F.(49° C.) 20%RH 4 days | 120° F.(49° C.) 20%RH 11 days |
| Control | — | 313 | 1.4 | 0.18 | 680 | 620 | 600 |
| Polymer A 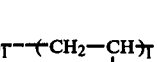 | 7.2 | 285 | 1.2 | 0.20 | 400 | 340 | 330 |
| Polymer B 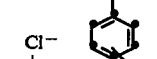 | 14.4 7.2 | 281 311 | 1.1 1.6 | 0.20 0.16 | 330 350 | 280 290 | 280 280 |
| Bis(vinylsulfonylmethyl)ether | 14.4 14.4 | 309 — | 1.4 — | 0.15 — | 310 190 | 240 180 | 230 190 |

[1]Percent swell was measured by determining film thicknesses using techniques well known in the art.

To a solution of 9.5 g (31.5 moles) of poly(vinylbenzyl-2-phenyl-2-hydroxyethyl sulfone) and 100 mg of m-dinitrobenzene inhibitor in 100 ml of pyridine at 0° to 5° C. was added 3.62 g (31.5 moles) of methanesulfonyl chloride. The solution was stirred for 3 hours at 0° to 5° C. and then at room temperature overnight. The polymer was isolated by precipitation in water, and dried in vacuo at room temperature. The polymer was redissolved in dimethylformamide, reprecipitated in water, collected, and dried at room temperature to give 6.6 g of product. The polymer remained soluble in dimethylformamide and 2-methoxyethanol ($\{\eta\}_{DMF}=1.15$).

Anal. Calcd for $C_{17}H_{16}SO_2$: C, 71.8; H, 5.7; S, 11.3; Found: C, 69.0; H, 6.1; S, 11.0.

EXAMPLE 5

Poly(vinylbenzyl Vinyl Sulfone-co-maleic anhydride)

To a solution of 30 g of vinylbenzyl 2-chloroethyl sulfone as described in Preparation 2 and 30 g of maleic anhydride in 240 ml of benzene are added 300 mg of benzoyl peroxide and the mixture is polymerized at 70° C. under a nitrogen atmosphere. To a solution of 37 g of the resulting copolymer in 125 ml of dimethylformamide at 0° to 5° C. was added 10.9 g (0.108 moles) of triethylamine. After stirring at room temperature for 1 hour, the triethylamine hydrochloride was removed by filtration and the polymer was precipitated in benzene. The product was collected, washed well with benzene, and dried to give 35 g of product $\{\eta\}_{DMF}=0.45$.

Anal. Calcd for $C_{15}H_{14}O_5S$: C, 58.8; H, 4.6; S, 10.5; Cl, 0; Found: C, 56.8; H, 5.2; S, 9.5; Cl, 0.8.

EXAMPLE 6

Samples of the polymers A and B with pendent vinylsulfonyl groups were added to a high speed gelatin-silver bromoiodide photographic emulsion and the samples were coated on a cellulose acetate film support. The coatings were compared with controls without

EXAMPLE 7

Solutions of poly(disodium maleate-co-vinylbenzyl vinyl sulfone) were mixed with solutions of bone gelatin and the resultant solutions were coated on poly(ethylene terephthalate) film support. The five-minute swell profiles of the coatings are given in Table III.

The vinylsulfonyl polymer insolubilized the gelatin coatings at the level of 2 wt. percent or more based on dry gelatin weight.

Table III

Five-Minute Swell Profiles[a] of Bone Gelatin as a Function of Hardener Concentration

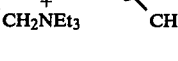

| mg/ft² Gel | mg/ft² Hardener | Swell (microns) |
|---|---|---|
| 200 | 0 | 21 |
| 100 | 100 | 8 |
| 180 | 20 | 6 |
| 190 | 10 | 8 |
| 195 | 5 | 4 |

[a]The measurements were made at 75° F. (24° C.)

EXAMPLE 8

Poly(N-isopropylacrylamide-co-vinylbenzyl vinyl sulfone) (1:1)m was coated from acetone on gel-washed poly(ethylene terephthalate) support at the level of 200 mg/ft² with 0 percent (control), 2.5 percent, 5 percent and 10 percent of hexamethylenediamine as a crosslinking agent. The coatings containing the diamine were immediately insoluble on drying while the control coating freely redissolved in acetone.

EXAMPLE 9

Poly(disodium maleate-co-vinylbenzyl vinyl sulfone) was coated as a 2 percent solution from either water or methanol on grained aluminum both unsensitized and sensitized with 5 percent Michler's ketone or 2-methoxy-2-phenylacetophenone, based on the dry polymer weight. The coatings were then differentially exposed to a high pressure mercury light source and developed in water or methanol. The exposed areas were crosslinked and insolubilized while the unexposed areas freely dissolved. The relative speeds of the coatings were about 50 to 100 unsensitized and 1,000 to 1,100 sensitized compared to about 2 for unsensitized poly(vinyl cinnamate).

This invention has been described in detail with particular reference to preferred embodiments thereof, but it will be understood that variations and modifications can be effected within the spirit and scope of the invention.

What is claimed is:

1. A polymer having repeating units having the formula:

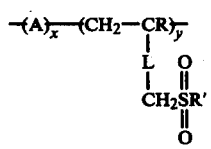

where A is a polymerized α,β-ethylenically unsaturated addition polymerizable monomer or a mixture of such polymerizable monomers, x is a molar unit of from 10 to 95, and y is a molar unit of from 5 to 90, L is a linking group selected from the group consisting of alkylene, arylene, COZ and COZR³, R³ is selected from the group consisting of alkylene and arylene, Z is O or NH, R is hydrogen or alkyl having 1 to 6 carbon atoms, and R' is —CH=CHR² or —CH₂CH₂X where X is a leaving group which can be displaced by a nucleophile or can be eliminated in the form of HX upon treatment with base and R² is hydrogen, alkyl or aryl.

2. The polymer of claim 1 wherein X is selected from the group consisting of chloro, bromo, iodo, acetoxy, methylsulfonyloxy, trimethylammonio salt, and pyridinio salt.

3. The polymer of claim 1 wherein A is 2-acrylamido-2-methylpropanesulfonic acid, acrylamide, vinylbenzyl chloride, styrene, or maleic anhydride, x is an integer of 1 to 9, and y is 9 to 1.

4. The polymer of claim 1 wherein L is phenylene.

5. The polymer of claim 1 having the structure:

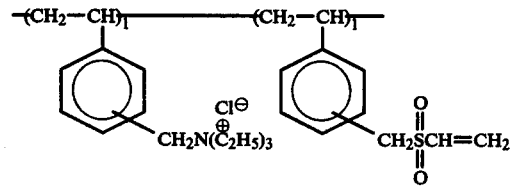

6. The polymer of claim 1 having the structure:

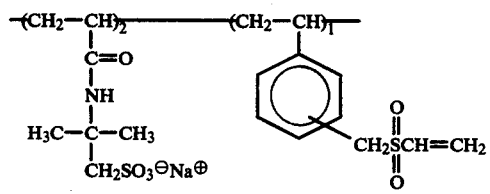

7. The polymer of claim 1 having the structure:

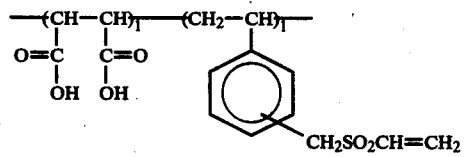

8. A composition comprising the polymer of claim 1 and gelatin.

9. A photographic element comprising a silver halide emulsion and the polymer of claim 1.

10. The photographic element of claim 9 also comprising gelatin.

* * * * *